(12) United States Patent
Tohoda et al.

(10) Patent No.: US 10,923,610 B2
(45) Date of Patent: Feb. 16, 2021

(54) SOLAR CELL AND SOLAR CELL MODULE

(71) Applicant: Panasonic Intellectual Property Management Co., Ltd., Osaka (JP)

(72) Inventors: Satoshi Tohoda, Osaka (JP); Masato Shigematsu, Osaka (JP); Kenta Matsuyama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 459 days.

(21) Appl. No.: 15/364,556

(22) Filed: Nov. 30, 2016

(65) Prior Publication Data
US 2017/0194524 A1 Jul. 6, 2017

(30) Foreign Application Priority Data

Sep. 30, 2015 (JP) .................................. 2015-195306
Mar. 23, 2016 (JP) .................................. 2016-057960

(51) Int. Cl.
*H01L 31/0747* (2012.01)
*H01L 31/0224* (2006.01)
*H01L 31/18* (2006.01)

(52) U.S. Cl.
CPC .. *H01L 31/022441* (2013.01); *H01L 31/0747* (2013.01); *H01L 31/1804* (2013.01); *Y02E 10/547* (2013.01); *Y02P 70/50* (2015.11)

(58) Field of Classification Search
CPC ............... H01L 31/028; H01L 31/0288; H01L 31/0352; H01L 31/03529; H01L 31/06; H01L 31/068; H01L 31/0682; H01L 31/0684; H01L 31/0687; H01L 31/072; H01L 31/0747; H01L 31/105; H01L 31/1055

See application file for complete search history.

(56) References Cited

U.S. PATENT DOCUMENTS

| 5,330,584 A | 7/1994 | Saga et al. |
| 2006/0283499 A1 | 12/2006 | Terakawa et al. |
| 2010/0275982 A1 | 11/2010 | Abbott et al. |

(Continued)

FOREIGN PATENT DOCUMENTS

| JP | 5-110121 A | 4/1993 |
| JP | 2006-237363 A | 9/2006 |

(Continued)

OTHER PUBLICATIONS

Taguchi et al., Prof. Photovolt: Res. Appl. 2000; 8: 503-513. (Year: 2000).*

(Continued)

*Primary Examiner* — Eli S Mekhlin
(74) *Attorney, Agent, or Firm* — Westerman, Hattori, Daniels & Adrian, LLP (57) ABSTRACT

Provided is a solar cell that can suppress loss of power generation performance of a solar cell module when shaded and a solar cell module having the solar cell. An n-type low-doped region and a first main-surface side highly doped region, which has an n-type dopant concentration higher than that in the n-type low-doped region, are provided in an n-type crystalline silicon substrate. The first main-surface side highly doped region is arranged between the n-type low-doped region and a p-type amorphous silicon layer.

12 Claims, 7 Drawing Sheets

(56) References Cited

U.S. PATENT DOCUMENTS

| | | | |
|---|---|---|---|
| 2011/0277816 A1 | 11/2011 | Xu et al. | |
| 2012/0031484 A1* | 2/2012 | Matsuno | C03C 3/072 |
| | | | 136/256 |
| 2012/0125392 A1 | 5/2012 | Woo et al. | |
| 2012/0180843 A1* | 7/2012 | Park | H01L 31/0201 |
| | | | 136/244 |
| 2014/0261660 A1 | 9/2014 | Hu et al. | |
| 2014/0360553 A1 | 12/2014 | Yoshidomi et al. | |
| 2015/0068591 A1* | 3/2015 | Chan | H01L 31/02244 |
| | | | 136/256 |
| 2017/0047459 A1* | 2/2017 | Yi | H01L 31/02167 |

FOREIGN PATENT DOCUMENTS

| | | |
|---|---|---|
| JP | 2013-69760 A | 4/2013 |
| JP | 2013-157457 A | 8/2013 |
| JP | 2014-93418 A | 5/2014 |
| JP | 2015-153934 A | 8/2015 |

OTHER PUBLICATIONS

Masuko et al., IEEE Journal of Photovoltaics, vol. 4, No. 6, Nov. 2014, Published Sep. 10, 2014, pp. 1433-1435. (Year: 2014).*

Final Office Action dated Oct. 9, 2018, issued in U.S. Appl. No. 15/393,870. (20 pages).

Taguchi, Mikio et al., HIT(TM) cells-High-efficiency crystalline Si cells with novel structure, Progress in Photovoltaics Research and Applications, Sep. 2000, pp. 503-513.

Masuko, Keiichiro et al., "Achievement of More Than 25% Conversion Efficiency With Crystalline Silicon Heterojunction Solar Cell", IEEE Journal of Photovoltaics, vol. 4, No. 6, Nov. 2014, pp. 1433-1435.

Non Final Office Action dated Jan. 17, 2018, issued in U.S. Appl. No. 15/393,870 (26 pages).

Extended (supplementary) European Search Report dated Mar. 6, 2019, issued in counterpart EP Application No. 16895543.3. (8 pages).

Final Office Action dated Oct. 29, 2019, issued in counterpart U.S. Appl. No. 15/393,870 (24 pages).

Notice of Allowance dated May 19, 2020, issued in U.S. Appl. No. 15/393,870 (14 pages).

* cited by examiner

SOLAR CELL AND SOLAR CELL MODULE

CROSS REFERENCE TO RELATED APPLICATION

The entire disclosures of Japanese Patent Application No. 2015-195306 filed on Sep. 30, 2015, and No. 2016-057960 filed on Mar. 23, 2016, including specification, claims, drawings and abstract are incorporated herein by reference in their entireties.

TECHNICAL FIELD

The disclosure relates to a solar cell and a solar cell module.

BACKGROUND ART

As a conventional solar cell module, a solar cell module having a bypass diode is known, as described in Patent Literature 1. The solar cell module has a plurality of solar cell strings connected in series and a plurality of bypass diodes connected in series. The solar cell string has a plurality of solar cells connected in series. Two solar cell strings connected in series constitute one unit. Each of the bypass diodes is connected in parallel to the respective units that are different from each other (hereinafter referred to as a string unit).

When a Solar cell(s) within a solar cell string is shaded by a barrier and the shaded area increases, electric current flows to a bypass diode connected in parallel to the string unit containing the solar cell(s). Likewise, a string unit containing a shaded solar cell(s) is bypassed to prevent no output from the solar cell module.

CITATION LIST

Patent Literature

Patent Literature 1: Japanese Patent Laid-Open Publication No. 2013-157457

With the solar cell module disclosed in Patent Literature 1, if solar cells are shaded the string unit containing the solar cells is bypassed and thus not all the solar cells in the string unit contribute to power generation. Accordingly, power generation of solar cells not shaded within the string unit is also prevented, leading to a great decrease in power generation performance.

SUMMARY

An object of the disclosure is to provide a solar cell that successfully suppresses loss of power generation performance of a solar cell module when shaded and a solar cell module containing the solar cell.

A solar cell according to an embodiment of the disclosure has a first conductive-type silicon substrate, and a second conductive-type amorphous silicon layer positioned on a first main-surface side of the silicon substrate. The silicon substrate has a low-doped region which has been doped to be a first conductive-type, and a first main-surface side highly doped region provided between the low-doped region and the second conductive-type amorphous silicon layer and having a concentration of a first conductive-type dopant higher than that in the low-doped region.

Note that the requirement "a second conductive-type amorphous silicon layer positioned on a first main-surface side of the silicon substrate" is satisfied in the case where the second conductive-type amorphous silicon layer is in contact with the first main-surface side of the silicon substrate. The requirement "a second conductive-type amorphous silicon layer positioned on a first main-surface side of the silicon substrate" is also satisfied in the case where the second conductive-type amorphous silicon layer faces the first main-surface of the silicon substrate with a layer such as an intrinsic semiconductor layer sandwiched between the second conductive-type amorphous silicon layer and the first main-surface of the silicon substrate.

According to the solar cell disclosed as an embodiment of the disclosure, it is possible to suppress loss of power generation performance of a solar cell module when shaded.

BRIEF DESCRIPTION OF DRAWINGS

Embodiments of the present disclosure will be described based on the following figures, wherein.

DESCRIPTION OF EMBODIMENTS

Now, embodiments according to the present disclosure (hereinafter referred to as the embodiments) will be more specifically described below with reference to the accompanying drawings. The specific shapes, materials, numerical values, directions and others set forth in the description are just examples for facilitating understanding of this disclosure and can be appropriately varied depending upon e.g., usage, purpose and specification. Furthermore, although a plurality of embodiments and modified examples are contained below, using the characteristic parts of them appropriately in combination falls within the scope assumed. The drawings used in the embodiments as a reference are schematically illustrated and the dimensional ratios of components shown in the drawings are sometimes different from actual dimensions. In the specification, the description: "substantially . . . " leans, if it is illustrated by taking the description "substantially the entire region" as an example, that not only the entire region but also the region that is recognized as substantially the entire region is included.

First Embodiment

Figure 1:
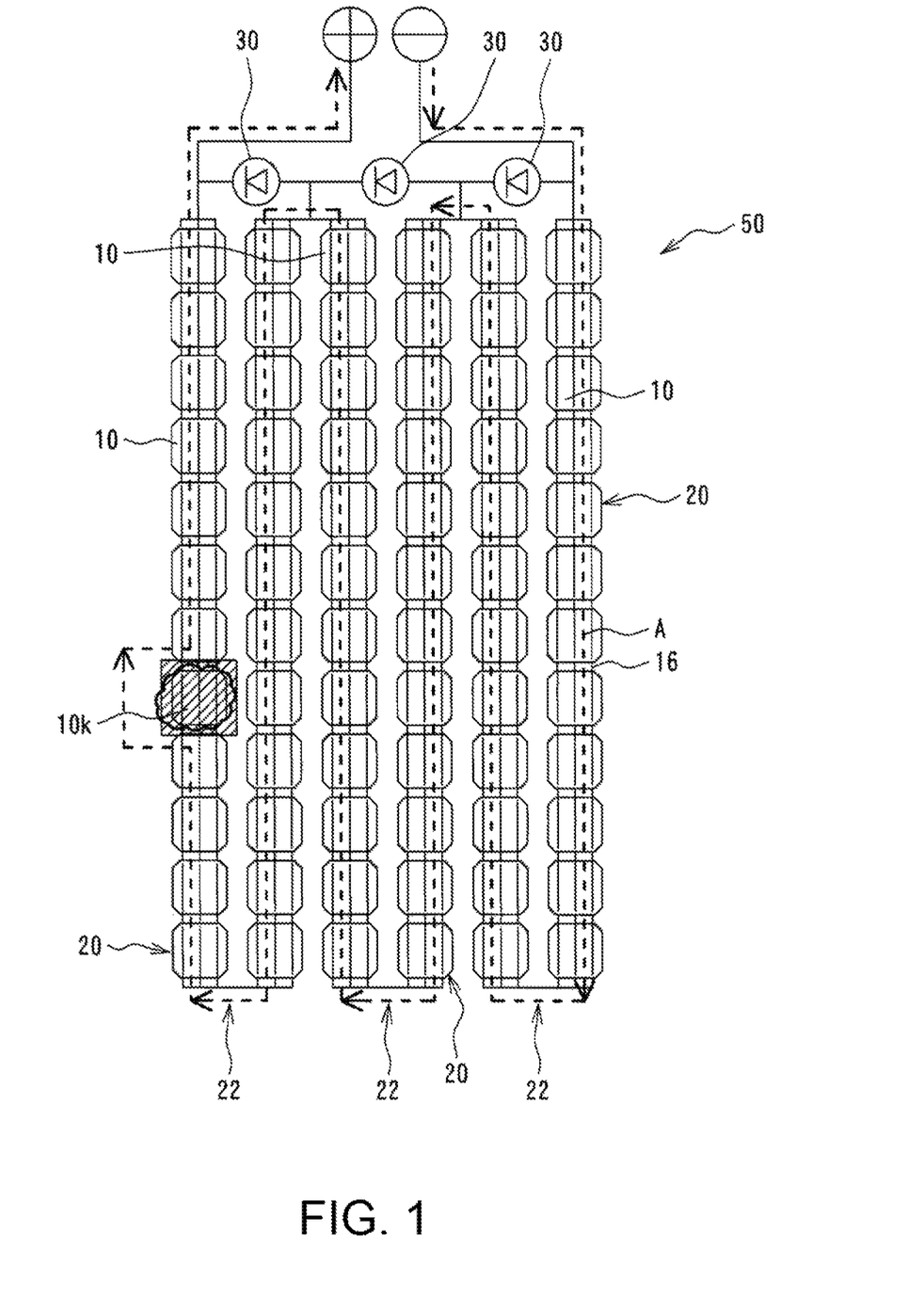
FIG. 1 is a schematic configuration diagram showing the main part of a solar cell module according to a first embodiment.

FIG. 1 is a schematic configuration diagram showing the main part of a solar cell module 50 of the first embodiment.

As shown in FIG. 1, the solar cell module 50 has 6 solar cell strings 20 and 3 bypass diodes 30. The 6 solar cell strings 20 are connected in series. The solar cell string 20 has 12 solar cells 10, which are connected in series by a wiring material 16. The 3 bypass diodes 30 are connected in series. A single unit 22 (hereinafter referred to as a string unit) is constituted of 2 solar cell strings connected in series. Each of the bypass diodes 30 is connected in parallel to one of the mutually different string units 22.

Note that the flow indicated by dashed line A in FIG. 1 is the flow of electric current produced by power generation of the solar cell 10. A hatched single solar cell 10k in FIG. 1 is a solar cell shaded by a barrier (not shown). The power generation mechanism of a solar cell module 50 having a shaded solar cell 10k will be described later with reference to e.g., FIG. 3.

Figure 2:
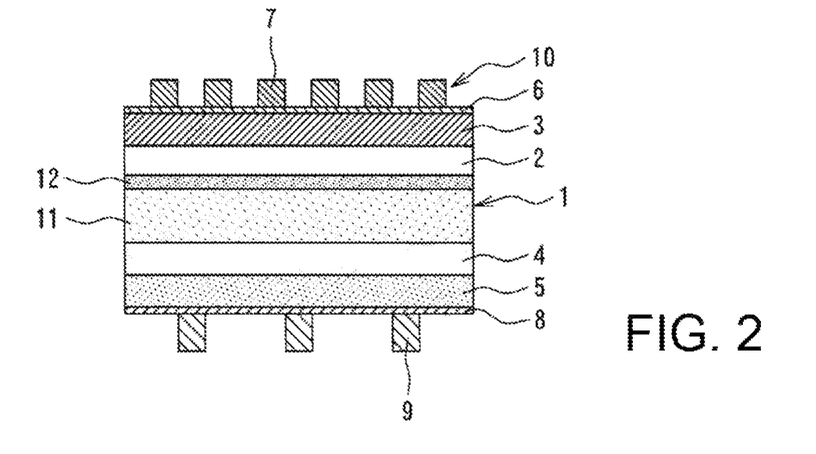
FIG. 2 is a schematic sectional view showing a solar cell of the solar cell module.

FIG. 2 is a schematic sectional view showing a solar cell 10. As shown in FIG. 2, the solar cell 10 has an n-type (first conductive-type) crystalline silicon substrate (hereinafter referred to as the n-type silicon substrate) 1, a first i-type amorphous silicon layer 2, a p-type (second conductive-type) amorphous silicon layer (hereinafter referred to as the p-type amorphous silicon layer) 3, a second i-type amorphous silicon layer 4 and an n-type amorphous silicon layer 5. The n-type silicon substrate 1 may be an n-type polycrystalline silicon substrate and preferably an n-type monocrystal silicon substrate.

The first i-type amorphous silicon layer 2 is firmed on a first main-surface of the n-type silicon substrate 1. The p-type amorphous silicon layer 3 is provided on a first surface side of the n-type silicon substrate 1. In other words, the p-type amorphous silicon layer 3 is provided on the first i-type amorphous silicon layer 2 on the opposite side to the side facing the n-type silicon substrate 1. The second i-type amorphous silicon layer 4 is provided on the second main-surface of the n-type silicon substrate 1. The n-type amorphous silicon layer 5 is provided on the second i-type amorphous silicon layer 4 on the opposite side to the side facing the n-type silicon substrate 1.

The first i-type amorphous silicon layer 2, p-type amorphous silicon layer 3, second i-type amorphous silicon layer 4 and n-type amorphous silicon layer 5 have a function of suppressing recombination of photogenerated carriers. These silicon layers 2, 3, 4 and 5 are suitably formed by a chemical vapor deposition (CVD) method, in particular, a plasma CVD method. As the source gas for use in film-formation of the silicon layers 2, 3, 4 and 5, a silicon-containing gas such as $SiH_4$, $Si_2H_6$ or a gas mixture of the silicon-containing gas and $H_2$ is suitably used. As a dopant gas for forming the p-type or n-type amorphous silicon layer 3 and 5, for example, $B_2H_6$ or $PH_3$ is suitably used. The addition amount of impurity such as P and B may be small and a gas mixture containing $SiH_4$ and $H_2$ can be used.

The first and second i-type amorphous silicon layers 2 and 4 are each preferably an i-type hydrogenated amorphous silicon layer (i-type a-Si:H). The p-type amorphous silicon layer 3 is preferably a p-type hydrogenated amorphous silicon layer (p-type a-Si:H). The n-type amorphous silicon layer 5 is preferably an n-type hydrogenated amorphous silicon layer (n-type a-Si:H). The layer (i-type a-Si:H) can be formed by the CVD method using a source gas prepared by diluting $SiH_4$ with $H_2$. The layer (p-type a-Si:H) is formed by using a source gas prepared by adding $B_2H_6$ to $SiH_4$ and diluting the gas mixture with hydrogen. The layer (n-type a-Si:H) is formed by using a source gas containing $PH_3$ in place of $B_2H_6$. Note that each of the amorphous silicon layers 2 to 5 is not necessarily hydrogenated. The film formation method for each of the semiconductor layers is not particularly limited.

As shown in FIG. 2, the n-type silicon substrate 1 has a low-doped region 11 and a first main-surface side highly doped region 12. The low-doped region 11 is doped to be air n-type. The first main-surface side highly doped region 12 is provided between the low-doped region 11 and the p-type amorphous silicon layer 3 and has an n-type dopant concentration higher than that in the low-doped region 11. The n-type dopant concentrations in the low-doped region 11 and the first main-surface side highly doped region 12 will be described later with reference to FIG. 3. The first main-surface side highly doped region 12 is provided over the entire surface of the low-doped region 11 on the side of the p-type amorphous silicon layer 3. The first main-surface side highly doped region 12 is an $n^+$ region doped with a larger amount of an n-type dopant than that in the low-doped region 11. Each of the low-doped region 11 and the first main-surface side highly doped region 12 is formed by e.g., an ion implantation method, a thermal diffusion method, a plasma doping method or an epitaxial growth method. As the n-type dopant, e.g., P, As and Sb are used, and in particular. P is suitably used. P is suitably doped while suppressing generation of defects by using a gas mixture with $POCl_3$ gas and applying a heat treatment. If an ion implantation method is employed, high temperature annealing and RTA (Rapid Thermal Annealing) are preferably used in combination in order to reduce defects to be produced by ion implantation.

If a thermal diffusion method or a plasma doping method is used for forming the first main-surface side highly doped region 12, a concentration gradient is formed, which is a phenomenon where the (dopant) concentration gradually increases with distance from the low-doped region 11 of the n-type silicon substrate 1. If an epitaxial growth method is used, compared to the case where, for example, a thermal diffusion method is used, a dopant concentration can be rapidly increased at the boundary position between the low-doped region 11 and the first main-surface side highly doped region 12 and the dopant concentration in the entire first main-surface side highly doped region 12 can be easily equalized.

The solar cell 10 is assumed to receive light from the side of the n-type amorphous silicon layer 5. As shown in FIG. 2, the solar cell 10 has a transparent conductive layer 6 and a rear-side collector electrode 7 which are sequentially provided in this order on the p-type amorphous silicon layer 3, on the rear-side (opposite to the light receiving side). The solar cell 10 has a transparent conductive layer 8 and a front-side collector electrode 9, which are sequentially provided in this order on the n-type amorphous silicon layer 5 on the front-side (the light receiving side). The transparent conductive layer 6 is for hied over substantially the entire region of the rear surface of the p-type amorphous silicon layer 3, whereas the transparent conductive layer 8 is formed over substantially the entire region of the front-side surface of the n-type amorphous silicon layer 5. Each of the transparent conductive layers 6 and 8 has transparency and conductivity. Each of the transparent conductive layers 6 and 8 is constituted of, for example, a metal oxide such as $In_2O_3$, ZnO, SnO$_2$ or TiO$_2$. These metal oxides may be doped with a dopant such as Sn, Zn, W, Sb, Ti, Ce, Zr, Mo, Al, and Ga.

The rear-side and front-side collector electrodes 7 and 9 are formed by screen printing of a conductive paste with a pattern having for example, a large number of finger parts and bus bar parts lower in number than the finger parts. The rear-side collector electrode 7 is preferably formed so as to have a larger area than the front-side collector electrode 9 and the number of the finger parts of the rear-side collector electrode 7 is preferably larger than that of the front-side collector electrode 9. Note that the structure of the electrodes is not particularly limited. For example, the rear-side collector electrode may be constituted of a metal layer, which is formed over substantially the entire region of the transparent conductive layer.

The solar cell 10 is assumed to receive light from the side of the n-type amorphous silicon layer 5. However, the solar cell may receive light from the side of the p-type amorphous silicon layer. Alternatively, the solar cell may receive light from both sides, i.e., the side of the p-type amorphous silicon layer and the side of the n-type amorphous silicon layer. The first main-surface side of the n-type silicon substrate 1 is preferably specified as a non-light incident surface. This is because carrier mobility is low in a highly doped region. Accordingly, if the highly doped region is specified as a light incident surface, carriers generated in the highly doped region are easily recombined, with the result that the short circuit photocurrent density decreases in connection with the intensity of the light to be irradiated. The decrease in the short circuit photocurrent density can be suppressed by setting the highly doped region in the opposite side to the light incident surface.

Figure 3:
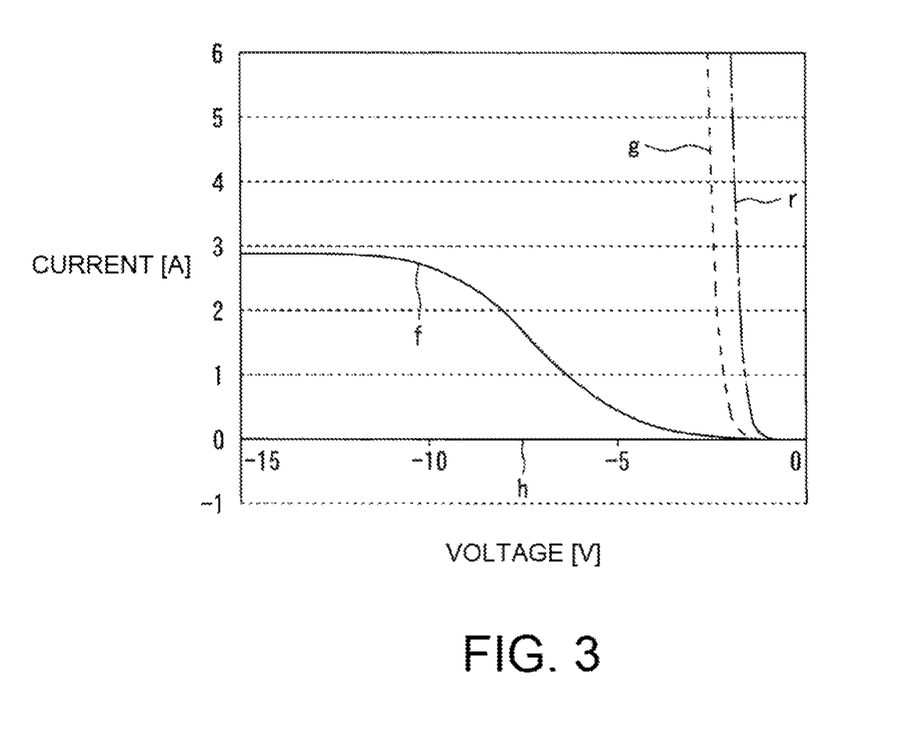
FIG. 3 is a graph showing the results of a test example for voltage-current characteristic of a solar cell.

FIG. 3 is a graph showing the voltage-current characteristic of the solar cell 10 according to a test example. In the test example, the average doping concentration of P doped in the low-doped region 11 is about $1.8 \times 10^{15}$ cm$^{-3}$. In FIG. 3, solid line f shows the voltage-current characteristic in the case where the average concentration of P doped in the first main-surface side highly doped region 12 is $1 \times 10^{18}$ cm$^{-3}$. Dotted line g shows the voltage-current characteristic in the case where the average concentration of P doped in the first main-surface side highly doped region 12 is $5 \times 10^{18}$ cm$^{-3}$. Dot-and-dash line r shows the voltage-current characteristic in the case where the average concentration of P doped in the first main-surface side highly doped region 12 is $1 \times 10^{19}$ cm$^{-3}$. Solid line h shows the voltage-current characteristic of the solar cell according to a reference example where an n-type silicon substrate is constituted of a low-doped region alone without the first main-surface side highly doped region.

As indicated by solid line h, in the case of the solar cell according to the reference example where the first main-surface side highly doped region was not provided, even if a voltage drop was increased up to 15 V, no electric current flowed. In contrast, in the case of the solar cell indicated by solid line f, if a voltage drop was about 2 V or more, electric current flow gradually started and the electric current value finally reached a plateau at around 3 A. In the cases indicated by dotted line g and dot-and-dash line r where the average concentration of P is $5 \times 10^{18}$ cm$^{-3}$ or more, when the voltage drop reached 1.5 V or more, electric current flow rapidly started, and finally, the voltage drop reached nearly 2V or less at an electric current of 6 A. Likewise, satisfactory voltage-current characteristic was obtained.

Figure 4:
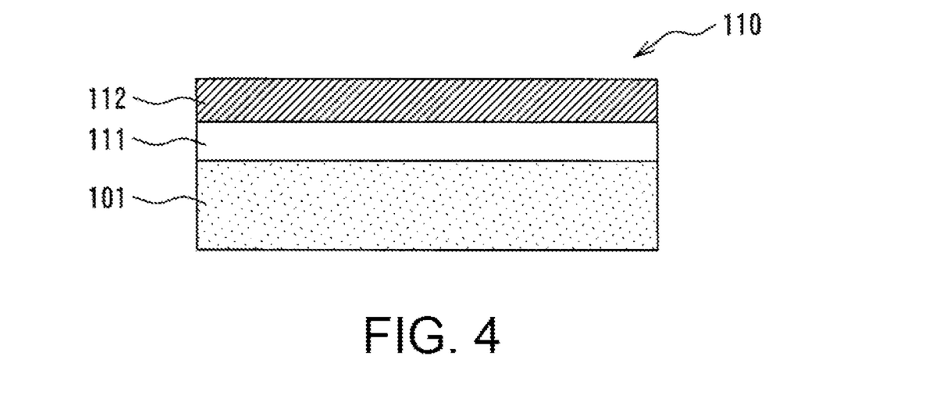
FIG. 4 is a schematic sectional view showing a partial structure of a solar cell according to a reference example.
Figure 5:
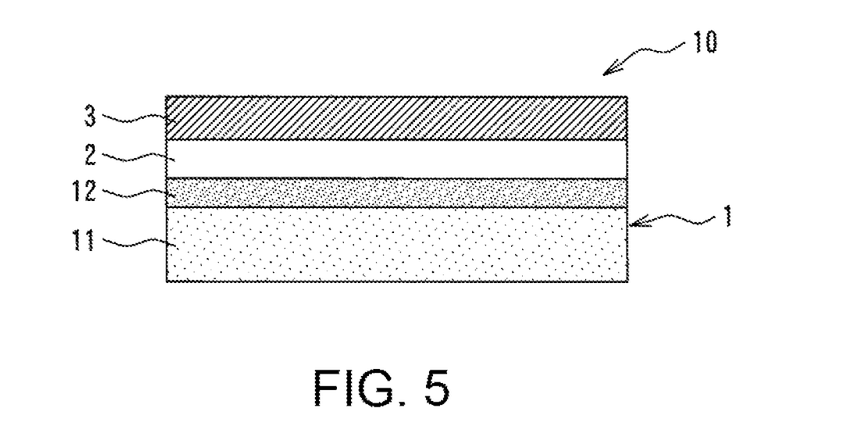
FIG. 5 is a schematic sectional view showing the solar cell of the first embodiment comparable to FIG. 4.

FIG. 4 is a schematic sectional view Showing a partial Structure of a solar cell 110 according to the reference example. The solar cell 110 has an n-type crystalline silicon substrate 101 having an average doping concentration P of $1 \times 10^{14}$ to $1 \times 10^{16}$ cm$^{-3}$. The solar cell 110 has a structure obtained by sequentially laminating an i-type amorphous silicon layer 111 and a p-type amorphous silicon layer 112 in this order on the n-type crystalline silicon substrate 101. FIG. 5 is a schematic sectional view showing the solar cell 10 of the embodiment, comparable to FIG. 4. The solar cell 10 has the n-type silicon substrate 1 having the low-doped region 11 and the first main-surface side highly doped region 12. The solar cell 10 has a structure obtained by subsequently laminating the i-type amorphous silicon layer 11 and the p-type amorphous silicon layer 12 in this order on the n-type silicon substrate 1. The solar cell 110 of the reference example differs from the solar cell 10 in that a low-doped region and a first main-surface side highly doped region are not provided in the n-type crystalline silicon substrate 101 and that the n-type crystalline silicon substrate 101 has a uniform n-type dopant concentration.

It has been confirmed that the power generation performance of the solar cell 10 is the same as that of the solar cell 110 of the reference example. Note that it has also been confirmed that the power generation performance of a solar cell according to a modified example of the embodiment and the power generation performance of the solar cells of the following embodiments and modified examples thereof are the same as the power generation performance of the solar cell 110 of the reference example.

Figure 6:
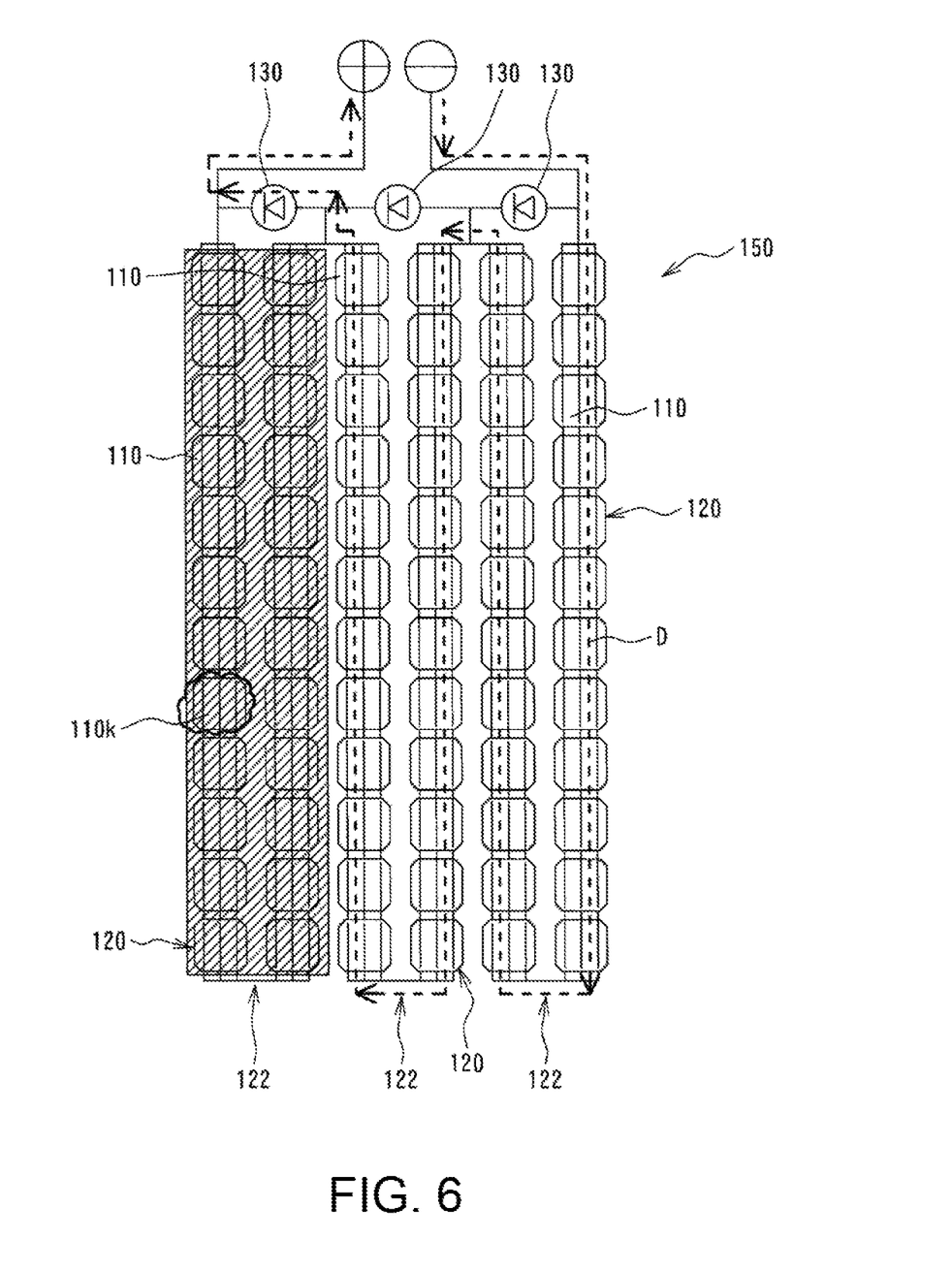
FIG. 6 is a schematic configuration diagram showing the main part of the solar cell module according to a reference example.

FIG. 6 is a schematic configuration diagram of a main part of a solar cell module 150 according to the reference example. The solar cell module 150 differs from the solar cell module 50 of the embodiment only in that the solar cell 110 shown in FIG. 4 is used in place of the solar cell 10. Now, the power generation performance of the solar cell module 50 of the embodiment shown in FIG. 1 when the solar cells 10 are shaded will be described in comparison with the power generation performance of the solar cell module 150 of the reference example having a shaded solar cell 110. In the solar cell module 150 of the reference example, a string unit 122 is constituted of two solar cell strings 120 connected in series. Each bypass diode 130 is connected in parallel to one of the mutually different string units 122.

In the reference example shown in FIG. 6, a single solar cell 110$k$ is assumed to be shaded in the solar cell module 150. In this case, it is required to have an excessive voltage drop in order for electric current to flow to the solar cell 110$k$, as shown by reference symbol h (the reference example) in FIG. 3. Thus, in this case, as shown in FIG. 6, electric current flows to a bypass diode 130 connected in parallel to the string unit 122 and the string unit 122 having the solar cell 110$k$ is bypassed. Accordingly, electric current flows through the passage indicated by the dotted line pointed by arrow D in FIG. 6. Twenty four solar cells 110 present in the hatched region within the string unit 220 do not contribute to power generation. Likewise, a significant output loss is produced.

In contrast, in the case where a single solar cell 10$k$ is assumed to be shaded in the solar cell module 50 of the embodiment shown in FIG. 1, electric current rapidly flows in the solar cell 10$k$ due to a small voltage drop as indicated by dotted line g in FIG. 3. Accordingly, since the electric current flowing through the solar cell module 50 is generally not so large, the power consumption at the solar cell 10$k$, which is expressed by a product of the aforementioned small voltage and the "not-so-large" electric current, can be suppressed to a small value. In consideration of the fact that a large number of the solar cells 10 not shaded in the string unit 22 other than the solar cell 10k participate in power generation, the output loss of the solar cell module 50 of the embodiment is greatly reduced, compared to the solar cell module 150 of the reference example. Note that in the case of the embodiment, a single bypass diode 30 is connected in parallel to each string unit 22. This is because if a plurality of the solar cells 10 present in the same string unit 22 are shaded, output loss can be somewhat reduced by bypassing the string unit 22.

According to the first embodiment, the n-type low-doped region and the n-type first main-surface side highly doped region 12 which has a dopant concentration higher than the n-type low-doped region 11 are provided in the n-type silicon substrate 1. The n-type first main-surface side highly doped region 12 is provided between the n-type low-doped region 11 and the p-type amorphous silicon layer 3. Electric current can be supplied to the shaded solar cell 10k at a low voltage drop. Thus, loss of the power generation performance of the solar cell module 50, produced when the solar cell 10 is shaded, can be suppressed.

Note that in the first embodiment, a case where a layer for suppressing recombination (hereinafter referred to as the recombination suppressing layer) is formed by sequentially laminating the first i-type amorphous silicon layer 2 and the p-type amorphous silicon layer 3 in this order on the first main-surface side of the n-type silicon substrate 1 has been illustrated. In addition, it has also been illustrated that the first i-type amorphous silicon layer is preferably an i-type hydrogenated amorphous silicon layer (i-type a-Si:H) and that the p-type amorphous silicon layer 3 is preferably a p-type hydrogenated amorphous silicon layer (p-type a-Si:H). However, on the first main-surface side of the n-type silicon substrate 1, a recombination suppressing layer other than these layers may be formed. On the first main-surface side of the n-type silicon substrate 1, a recombination suppressing layer formed of a material selected from the following (1) to (6) and including these layers can be suitably formed: (1) p-type a-Si:H, (2) p-type a-SiC:H, (3) a laminate of i-type or p-type a-Si:H and high-concentration p-type a-Si:H (laminate of i-type or p-type a-Si:H/high concentration p-type a-Si:H), (4) a laminate of i-type or p-type a-Si:H/high concentration p-type hydrogenated microcrystalline silicon (p-type μc-Si:H) (5) a laminate of i-type or p-type a-SiC:H/high concentration p-type a-Si:H, and (6) a laminate of i-type or p-type a-SiC:H/high concentration p-type μc-Si:H. Furthermore, a recombination suppressing layer containing a p-type layer other than these, for example, a recombination suppressing layer including a non-hydrogenated p-type layer, can be formed. Herein, the term "high-concentration" means, if it is illustrated by taking "a laminate of p-type a-Si:H/high concentration p-type a-Si:H", as an example, that the dopant concentration of the latter layer is higher than that in the former layer. More specifically, this expression means that this is a structure obtained by laminating two layers having different dopant amounts.

Note that a case where the second i-type amorphous silicon layer 4 and the n-type amorphous silicon layer 5 are sequentially laminated in this order on the second main-surface side of the n-type silicon substrate 1 to form a recombination suppressing layer has been explained. It has been also illustrated that the second i-type amorphous silicon layer 4 is preferably an i-type hydrogenated amorphous silicon layer (i-type a-Si:H) and that the n-type amorphous silicon layer 5 is preferably an n-type hydrogenated amorphous silicon layer (n-type a-Si:H). However, a recombination suppressing layer other than these layers may be formed on the second main-surface of the n-type silicon substrate 1. A recombination suppressing layer formed of a material selected from the following (7) to (12) and including these layers can be suitably formed: (7) n-type a-Si:H, (8) n-type a-SiC:H (9) a laminate of i-type or n-type a-Si:H, and high concentration n-type a-Si:H (laminate of i-type or n-type a-Si:H/high concentration n-type a-Si:H), (10) a laminate of i-type or n-type a-Si:H/high concentration n-type hydrogenated microcrystalline silicon (n-type μc-Si:H), (11) a laminate of i-type or n-type a-SiC:H/high concentration n-type a-Si:H, (12) a laminate of i-type or n-type a-SiC:H/high concentration n-type μc-Si:H on the second main-surface sides of the n-type silicon substrate 1. Furthermore, a recombination suppressing layer containing a n-type layer other than these, for example, a recombination suppressing layer including a non-hydrogenated n-type layer, can be formed. Herein, the term "high-concentration" means, if it is illustrated by taking "a laminate of n-type a-Si:H/high concentration n-type a-Si:H", as an example, that the dopant concentration of the latter layer is higher than that in the former layer. More specifically, this expression means that this is a structure obtained by laminating two layers different having dopant amounts.

Note that a case where a protecting layer is not formed on the recombination suppressing layer present on the first and second main-surface sides of the n-type silicon substrate 1 has been illustrated. However, a protecting layer may be formed on at least one side of the recombination suppressing layers on the first and second main-surface sides of the n-type silicon substrate 1. The protecting layer has a function of for example, suppressing damage of the recombination suppressing layer, thereby suppressing reflection of light. The protecting layer is preferably constituted of a material having high transparency and suitably constituted of e.g., silicon oxide ($SiO_2$), nitride (SiN) or silicon oxynitride (SiON).

On the surface of the n-type silicon substrate 1, a texture structure (not shown) may be provided. The texture structure refers to a structure having an uneven surface for increasing light absorption of the n-type silicon substrate 1 by suppressing surface reflection, and is formed, for example, on the light receiving surface alone or on both the light receiving surface and the rear surface. The texture structure can be formed by anisotropic etching the (100) plane of the monocrystal silicon substrate with an alkaline solution. In this manner, a pyramidal uneven structure (the plane (111) as an oblique plane) is formed in the surface of the monocrystal silicon substrate. The distance between the highest part and the lowest part of uneven portions of the texture structure is, for example, 1 μm to 15 μm.

Needless to say, the thickness of each of the layers 1 to 5, 11 and 12 can be appropriately varied depending upon the specification. For example, the thickness of the n-type silicon substrate 1 can be set at 50 μm to 300 μm. The thickness of the n-type first main-surface side highly doped region 12 can be set at, for example, 200 nm or less, may be within the range of several to 500 nm, and suitably in the range 50 nm to 200 nm. The thickness of each of the recombination suppressing layers present on first and second main-surface sides of the n-type silicon substrate 1 can be set at 1 nm to 50 nm and preferably 2 nm to 15 nm.

If the surface doping concentration of the low-doped region 11 is $1 \times 10^{14}$ to $1 \times 10^{16}$ $cm^{-3}$, then when the surface doping P concentration of the first main-surface side highly doped region 12 is $1 \times 10^{18}$ $cm^{-3}$ or more, suitable results are obtained. However, the surface doping concentrations in the low-doped region and the first main-surface side highly doped region are not limited to these values. This is because the effect of the invention of the present application can be obtained by forming the first main-surface side highly doped region 12 having a surface doping concentration larger than the low-doped region 11. Even if the average doping concentration of the first main-surface side highly doped region 12 is smaller than $1\times10^{18}$ cm$^{-3}$, if the surface doping concentration of the low-doped region 11 is, for example, $1\times10^{15}$ cm$^{-3}$ or more and more preferably $5\times10^{15}$ cm$^{-3}$ or more, electric current flows due to a small voltage drop of about 2 V. Thus, even in this case, compared to the reference example where electric current does not flow until a voltage drop reaches 15 V, as indicated by a reference symbol h in FIG. 3, a tunnel effect is extremely easily produced. Accordingly, in this case, output loss of a solar cell module produced when a solar cell is shaded can be suppressed depending on the specification. At this time, the surface doping P concentration in the first main-surface side highly doped region 12 is further preferably $1\times10^{19}$ cm$^{-3}$ or more and $5\times10^{19}$ cm$^{-3}$ or less.

A case where the first main-surface side highly doped region 12 is provided over the entire surface of the low-doped region 11 on the p-type amorphous silicon layer 3 side has been illustrated. However, the first main-surface side highly doped region nay be provided on a part of the surface of the low-doped region on the p-type amorphous silicon layer side. For example, the first main-surface side highly doped region may be provided only on both ends or the center of the low-doped region 11 in the direction substantially perpendicular to the thickness direction.

A case where the first conductive-type is n-type and the second conductive-type is p-type has been illustrated, but a case where the first conductive-type is p-type and the second conductive-type is n-type may be accepted.

A case where the solar cell module 50 has 6 solar cell strings 20 and the solar cell string 20 has 12 solar cells 10 has been illustrated. However, the number of solar cell stings contained in the solar cell module may be other than 6, and the number of solar cells contained in each solar cell string may be other than 12. Furthermore, a case where a single bypass diode 30 is connected in parallel to a string unit 22 consisting of 2 solar cell string 20 connected in series, has been illustrated, but a single bypass diode may be connected in parallel to a string unit consisting of solar cell strings, the number of which is other than 2 (including one), connected in series. The solar cell module may not have a bypass diode.

Second Embodiment

Figure 7:
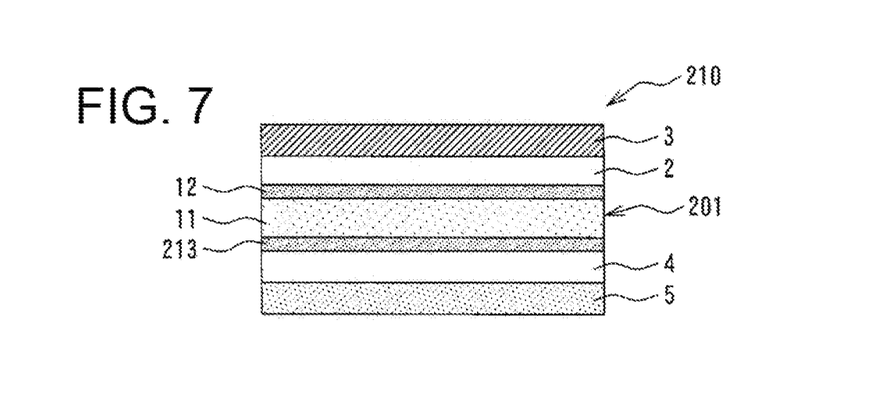
FIG. 7 is a schematic sectional view showing the solar cell main part of a second embodiment.

FIG. 7 is a schematic sectional view showing the lain part of a solar cell 210 according to a second embodiment. In FIG. 7, a transparent conductive layer and a collector electrode are not shown. In the solar cell of the second embodiment, the same reference numerals are used to designate the same structural elements corresponding to those in the first embodiment and any further explanation is omitted. In the solar cell of the second embodiment, any further explanation on the operational effect and modified example in common with those in the first embodiment is omitted and only the structure, operational effect and modified example, which differ from those of the first embodiment, will be described.

The second embodiment differs from the first embodiment in that an n-type crystalline silicon substrate 201 has a second main-surface side highly doped region 213 in addition to the low-doped region 11 and the first main-surface side highly doped region 12.

The second main-surface side highly doped region 213 is provided on a second main-surface side of the n-type crystalline silicon substrate 201. The second main-surface side highly doped region 213 is provided between the low-doped region 11 and the n-type amorphous silicon layer 5. The second main-surface side highly doped region 213 is provided over the entire surface of the low-doped region 11 on the side of the n-type amorphous silicon layer 5.

The second main-surface side highly doped region 213 has an average n-type dopant concentration higher than that in the low-doped region 11. The average n-type doping concentration of the second main-surface side highly doped region 213 may be the same as or different from the average n-type doping concentration of the first main-surface side highly doped region 12. The average n-type doping concentration of the second main-surface side highly doped region 213 can be appropriately varied and is preferably $1\times10^{18}$ cm$^{-3}$ or more.

The layer thickness of the second main-surface side highly doped region 213 may be the same as or different from that of the first main-surface side highly doped region 12. The layer thickness of the second main-surface side highly doped region 213 can be appropriately varied depending upon the specification. The layer thickness of the second main-surface side highly doped region 213 can be set at, for example, 200 nm or less may be within the range of several to 500 nm, and suitably 50 nm to 200 nm. If the n-type highly doped region is provided in the n-type crystalline silicon substrate 201 on the side of the n-type amorphous silicon layer 5 (second main-surface side), recombination of photogenerated carriers is suppressed and output is improved.

According to the second embodiment, since the second main-surface side highly doped region 213, which has a surface dopant concentration higher than that in the low-doped region 11, is provided between the low-doped region 11 and the n-type amorphous silicon layer 5, recombination of photogenerated carriers can be suppressed and output is improved. Particularly preferably, the n-type surface doping concentration of the first main-surface side highly doped region 12 is set at $1\times10^{18}$ cm$^{-3}$ or more and the n-type surface doping concentration of the second main-surface side highly doped region 213 is set at $1\times10^{17}$ cm$^{-3}$ or more. This is because an effect of suppressing a decrease in output of the solar cell module 50 when a solar cell (like 10k) is shaded and an effect of suppressing recombination of photogenerated carriers are both remarkably exerted. Note that at this time, the n-type surface doping concentration of the first main-surface side highly doped region 12 is further preferably $1\times10^{19}$ cm$^{-3}$ or more and $5\times10^{19}$ cm$^{-3}$ or less.

In the second embodiment, a case where the second main-surface side highly doped region 213 is provided over the entire surface of the low-doped region 11 oft the side of the n-type amorphous silicon layer 5, has been illustrated. However, the second main-surface side highly doped region may be provided only on a part of the surface of the low-doped region on the side of the n-type amorphous silicon layer. For example, the second main-surface side highly doped region may be provided only at both ends or the center of the low-doped region 11 in the direction substantially perpendicular to the thickness direction, or alternatively may be provided in plane like dots.

Third Embodiment

Figure 8:
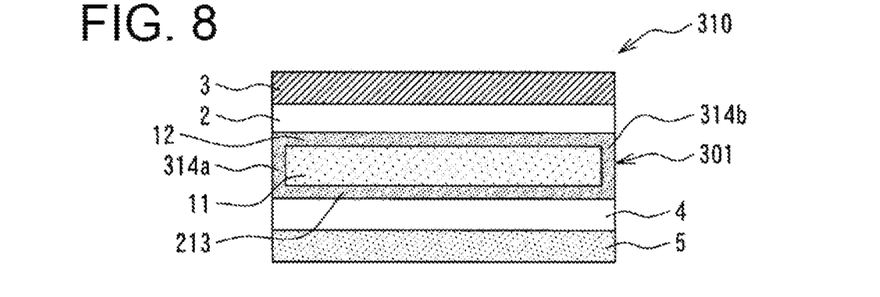
FIG. 8 is a schematic sectional view showing the solar cell main part of a third embodiment.

FIG. 8 is a schematic sectional view showing the main part of a solar cell 310 according to a third embodiment. A transparent conductive layer and a collector electrode are not shown in FIG. 8. In the solar cell 310 of the third embodiment, the same reference numerals are used to designate the same structural elements of a solar cell 210 corresponding to those in the second embodiment and further explanation is omitted. In the solar cell 310 of the third embodiment, any further explanation on the operational effect and modified example in common with those of the solar cells 10 and 210 in the first and second embodiments is omitted and only the structure, operational effect and modified example, which differ from those of the solar cells 10 and 210 in the first and second embodiments, will be described.

The third embodiment is the same as the second embodiment in that an n-type crystalline silicon substrate 301 has the n-type low-doped region 11, the first main-surface side highly doped region 12 and the second main-surface side highly doped region 213. In contrast, the third embodiment is different from the second embodiment in that the n-type crystalline silicon substrate 301 has first and second highly doped side-regions 314a and 314b, which are provided so as to cover both side surfaces of the n-type low-doped region 11.

As shown in FIG. 8, the n-type crystalline silicon substrate 301 has the first highly doped side-region 314a at one of the sides of the n-type low-doped region 11 in the direction substantially perpendicular to the thickness direction. The n-type crystalline silicon substrate 301 has the second highly doped side-region 314b at the other side of the n-type low-doped region 11 in the direction substantially perpendicular to the thickness direction. Each of the first and second highly doped side-regions 314a and 314b extends in the thickness direction of the n-type crystalline silicon substrate 301. The first highly doped side-region 314a connects the first main-surface side highly doped region 12 and the second main-surface side highly doped region 213 at one of the sides in the aforementioned substantially perpendicular direction. The second highly doped side-region 314b connects the first main-surface side highly doped region 12 and the second main-surface side highly doped region 213 at the other side in the aforementioned substantially perpendicular direction.

Each of the first and second highly doped side-regions 314a and 314b has an average n-type dopant concentration higher than that in the low-doped region 11. The average n-type dopant concentration of the first highly doped side-legion 314a may be the same as the average n-type dopant concentration of one or more regions of the first main-surface side highly doped region 12 and the second main-surface side highly doped region 213. The average n-type dopant concentration of, the first doped side-region 314a may differ from the average n-type dopant concentrations of both regions 12 and 213. The average n-type dopant concentration of the second highly doped side-region 314b may be the same as the average n-type dopant concentration of one or more regions of the first main-surface side highly doped region 12, the second main-surface side highly doped region 213 and the first highly doped side-region 314a. The average n-type dopant concentration of the second highly doped side-region 314b may differ from the average n-type dopant concentrations of these all regions 12, 213 and 314a. Each of the first and second highly doped side-regions 314a and 314b preferably has an average n-type dopant concentration of $1\times10^{18}$ cm$^{-3}$ or more. The layer thickness of each of the first and second highly doped side-regions 314a and 314b in the direction perpendicular to the substrate thickness direction can be appropriately varied depending upon the specification. The layer thickness of each of the first and second highly doped side-regions 314a and 314b in the direction perpendicular to the substrate thickness direction can be set at, for example, 200 nm or less, may be within the range of several to 500 nm, and suitably in the range 50 nm to 200 nm.

According to the third embodiment, since both side surfaces of the n-type crystalline silicon substrate 301 are covered with the first and second highly doped side-regions 314a and 314b, surface recombination at both side surfaces of the n-type crystalline silicon substrate 301 can be reduced and power generation performance can be improved.

In addition, since the n-type highly doped region is provided so as to surround the low-doped region 11 of the n-type crystalline silicon substrate 301, each of the highly doped regions 12, 213, 314a and 314b can be simultaneously and easily formed around the low-doped region 11 by e.g., heat diffusion using POCl$_3$ gas. Accordingly, the number of steps for manufacturing the solar cell 310 can be reduced and cycle time can be shortened. In this case, highly doped regions 12, 213, 314a and 314b all have the same average n-type dopant concentration of preferably $1\times10^{18}$ cm$^{-3}$ or more, and further preferably $1\times10^{19}$ cm$^{-3}$ or more and $5\times10^{19}$ cm$^{-3}$ or less.

Note that in the third embodiment, a case where the first and second highly doped side-regions 314a and 314b are provided so as to cover the both side surfaces of the n-type low-doped region 11 has been illustrated. However, the highly doped side-region may be provided only on one of the side surfaces of the n-type low-doped region 11.

Figure 9:
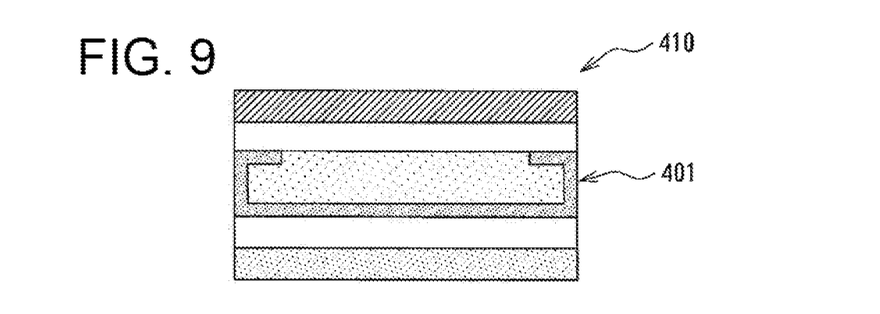
FIG. 9 is a schematic sectional view showing the solar cell main part according to a modified example of the third embodiment.

Another case where the first and second highly doped side-regions 314a and 314b connect the first main-surface side highly doped region 12 and the second main-surface side highly doped region 213, has been illustrated. However, at least one highly doped side-region may not connect the first main-surface side highly doped region and the second main-surface side highly duped region. At least one highly doped side-region is provided only on a part of the side surfaces of the low-doped region. If the second main-surface side highly doped region is not present, the highly doped side-region may be provided on at least a part of the side surfaces of the low-doped region. As shown in FIG. 9, more specifically, the schematic sectional view showing the main part of a solar cell 410 according to a modified example of the third embodiment, the n-type highly doped region may not be provided in the center of an n-type silicon substrate 401 on the first main-surface side. As shown in FIG. 9, the first main-surface side highly doped region may be provided only at both ends of the n-type silicon substrate 401 in the direction substantially perpendicular to the thickness direction. Note that a transparent conductive layer and a collector electrode are not shown in FIG. 9.

Fourth Embodiment

Figure 10:
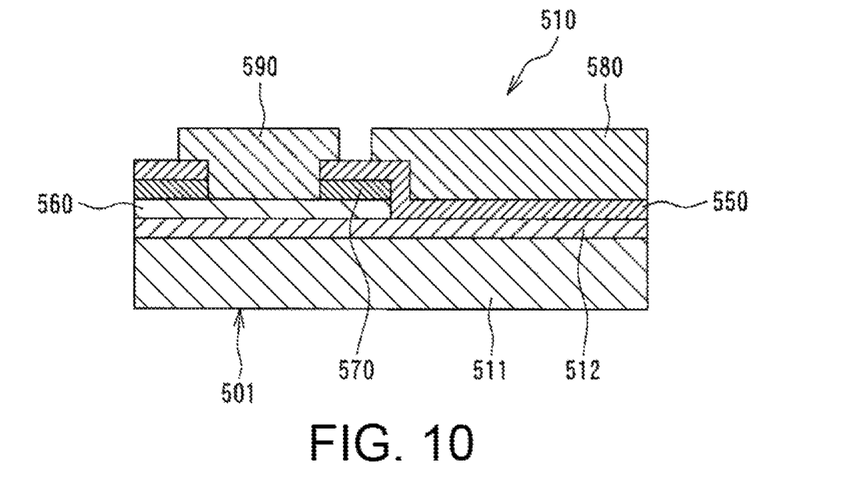
FIG. 10 is a schematic sectional view showing a solar cell of a fourth embodiment.

FIG. 10 is a schematic sectional view showing a solar cell 510 of a fourth embodiment. In the solar cell 510 of the fourth embodiment, any further explanation on the operational effect and modified example in common with the solar cell 10 in the first embodiment is omitted and only the structure, operational effect and modified example, which differ from the solar cell 10 of the first embodiment, will be described.

The solar cell 510 of the fourth embodiment differs from those of the first to third embodiments in that a p-type semiconductor layer 550 and an n-type semiconductor layer 560 are provided on the first main-surface side of an n-type crystalline silicon substrate 501.

As shown in FIG. 10, the solar cell 510 has the n-type crystalline silicon substrate (hereinafter referred to simply as the substrate) 501, the p-type semiconductor layer 550 and the n-type semiconductor layer 560, which are formed on the first main-surface of the substrate 501. The p-type conductor layer 550 and the n-type semiconductor layer 560 have a portion mutually overlapped in the thickness direction. An insulating layer 570 is provided in the space of the overlapped portion in the thickness direction. The light receiving surface of the substrate 501 corresponds to the surface opposite to the first main-surface of the substrate 501. The solar cell 510 has an n-type low-doped region 511 and an n-type first main-surface side highly doped region 512. The n-type first main-surface side highly doped region 512 has an average n-type doping concentration higher than that in the n-type low-doped region 511. The n-type first main-surface side highly doped region 512 is formed over the entire surface of the n-type low-doped region 511 on the opposite side to the light receiving surface side.

A part of the n-type first main-surface side highly doped region 512 is provided between the n-type low-doped region 511 and the p-type semiconductor layer 550. The p-type semiconductor layer 550 is constituted of, for example, a laminated structure formed of an i-type amorphous silicon layer and a p-type amorphous silicon layer, as described in the first embodiment. The p-type semiconductor layer 550 may be constituted of a recombination suppressing layer formed of a material selected from the above (1) to (6).

The other part of the n-type first main-surface side highly doped region 512 is provided between the n-type low-doped region 511 and the n-type semiconductor layer 560. The n-type semiconductor layer 560 is constituted of a laminated structure formed of, for example, an i-type amorphous silicon layer and an n-type amorphous silicon layer, as described in the first embodiment. The n-type semiconductor layer 560 may be constituted of a recombination suppressing layer formed of a material preferably selected from the above (7) to (12).

On the side of the p-type semiconductor layer 550 opposite to the side of the substrate 501 a p-side electrode 580 is provided. The p-side electrode 580 consists of a transparent conductive layer formed on the p-type semiconductor layer 550 and a collector electrode formed on the transparent conductive layer. On the side of the n-type semiconductor layer 560 opposite to the side of the substrate 501, an n-side electrode 590 is provided. The n-side electrode 590 consists of a transparent conductive layer formed on the n-type semiconductor layer 560 and a collector electrode formed on the transparent conductive layer. A shadow loss is suppressed by arranging both the p-side electrode 580 and the n-side electrode 590 on the substrate 501 on the opposite side to the light receiving surface side.

As a material for each of the transparent conductive layers and a manufacturing method thereof, the material and manufacturing method as described in the first embodiment can be suitably used. Each collector electrode may be formed by using a conductive paste and preferably formed by electrolytic plating. The aforementioned rear side and front-side collector electrode is each formed of a metal such as Ni, Cu and Ag, may be a laminated structure of an Ni layer and a Cu layer, and, may have a tin (SN) layer on the outermost surface in order to improve corrosion resistance. As a suitable laminated structure of the transparent conductive layer and the collector electrode there is a laminated structure of a transparent conductive layer formed of indium tin oxide (ITO) and a collector electrode formed of Cu.

The p-side electrode 580 and the n-side electrode 590 are not in contact with each other and are electrically separated. The solar cell 510 has a pair of electrodes formed only on the rear side of the n-type crystalline silicon substrate 501. Holes produced in the power generation region are collected by the p-side electrode, whereas electrons are collected by the n-side electrode.

The p-type semiconductor layer 550 and the n-type semiconductor layer 560 are both laminated on the rear surface of the n-type crystalline silicon substrate 501 to form a p-type region and an n-type region on the rear surface. The p-type region and the n-type region are alternately arranged, for example, in a single direction, and engaged with each other like a comb tooth (shape pattern) in the planar view. In the example shown in FIG. 10, a part of the p-type semiconductor layer 550 overrides a part of the n-type semiconductor layer 560 to form individual semiconductor layers (p-type region, n-type region) without space between them on the rear surface of the n-type crystalline silicon substrate 501. At the portion at which the p-type semiconductor layer 550 overlaps with the n-type semiconductor layer 560, the insulating layer 570 is provided. The insulating layer 570 is formed of, for example, silicon oxide, silicon nitride or silicon oxynitride. In each layer and each region, the dopant concentration, layer thickness and production method for each layer can be appropriately varied depending upon the specification. As the concentration, layer thickness and production method for each layer, those described in the first embodiment and the modified example can be employed.

According to the fourth embodiment, a part of the first main-surface side highly doped region 512, which is formed over the entire surface of the low-doped region 511 on the opposite side to the light receiving surface side, is positioned between the n-type low-doped region 511 and the p-type semiconductor layer 550. On the other hand, the other part of the first main-surface side highly doped region 512 is positioned between the n-type low-doped region 511 and the n-type semiconductor layer 560. Thus, the layers corresponding to first and second main-surface side highly doped regions 12 and 213 in the second embodiment can be simultaneously formed only by providing one highly doped region 512 on the low-doped region 511 on the opposite side to the light receiving surface side. Accordingly, an effect of suppressing a decrease in output of the solar cell module when a solar cell is shaded and an effect of suppressing recombination of photogenerated carriers can be easily obtained.

Figure 11:
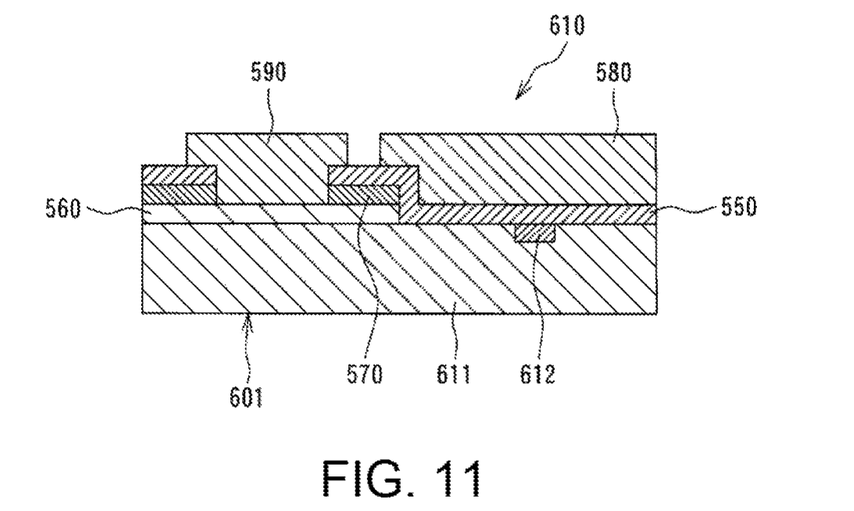
FIG. 11 is a schematic sectional view showing a solar cell according to a modified example of the fourth embodiment.

In the fourth embodiment, a case where the first main-surface side highly doped region 512 is provided over the entire surface of the n-type low-doped region 511, has been illustrated. However, the first main-surface side highly doped region may not be provided over the entire surface of the n-type low-doped region. FIG. 11 is a schematic sectional view showing a solar cell 610 according to a modified example of the fourth embodiment. In the modified example, the same reference numerals are used to designate the same structural elements corresponding to those in the fourth embodiment and any thither explanation is omitted. As shown in FIG. 11, in the modified example, a first main-surface side highly doped region 612 is provided partly between an n-type low-doped region 611 and the p-type semiconductor layer 550 in an n-type crystalline silicon substrate 601. Like the modified example, if the first main-surface side highly doped region 612 is not provided between the n-type low-doped region 611 and the n-type semiconductor layer 560, a decrease in output of the solar cell module when a solar cell 610 is shaded, can be suppressed. Note that the first main-surface side highly doped region is provided over the entire region between the n-type low-doped region of the n-type crystalline silicon substrate and the p-type semiconductor layer, and is not provided between the n-type low-doped region of the n-type crystalline silicon substrate and the n-type semiconductor layer. Alternatively, the first main-surface side highly doped region is provided over the entire region between the n-type low-doped region and the p-type semiconductor layer in the n-type crystalline silicon substrate and may be provided partly between the n-type low-doped region and the n-type semiconductor layer in the n-type crystalline silicon substrate. Alternatively, the first main-surface side highly doped region is provided only partly between the n-type low-doped region and the p-type semiconductor layer in the n-type crystalline silicon substrate and may be provided only partly between the n-type low-doped region and the n-type semiconductor layer in the n-type crystalline silicon substrate.

MODIFIED EXAMPLE

In each of the aforementioned embodiments, a highly doped region was formed by an ion implantation method, a thermal diffusion method, a plasma doping method or an epitaxial growth method. A highly doped region with a predetermined conductive-type dopant may be formed by a method belonging to the thermal diffusion method, i.e., a method of diffusing the predetermined conductive-type dopant in a crystalline silicon substrate by applying a step of bringing a solution containing the predetermined conductive-type dorm it into contact with the surface of the crystalline silicon substrate, followed by a heat treatment step of the crystalline silicon substrate, or alternatively, by preparing a solution containing the predetermined conductive-type dopant for oxidizing silicon, bringing the solution into contact with the crystalline silicon substrate to form a silicon oxide layer containing the predetermined conductive-type dopant on the surface of the crystalline silicon substrate, and thereafter applying the heat treatment step to diffuse the predetermined conductive-type dopant from the silicon oxide layer to the surface of the crystalline silicon substrate. For example, an n-type highly doped region may be formed by using a solution containing an n-type dopant, such as P, As and Sb. A case of using a particularly preferably n-type dopant P will be more specifically described by way of a modified example of the third embodiment.

Figure 12:
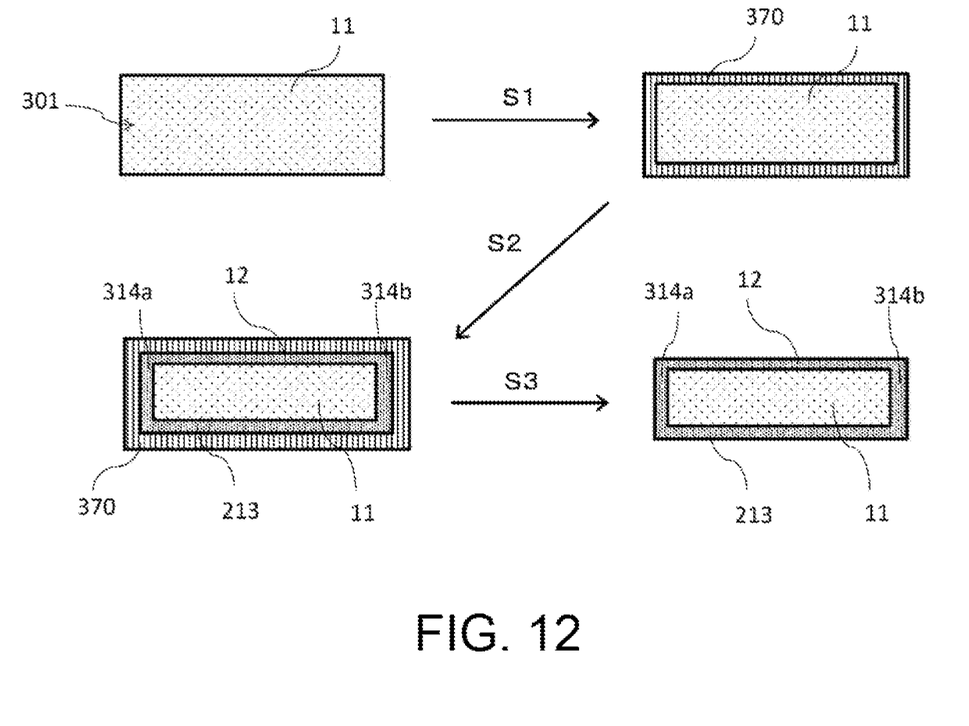
FIG. 12 shows a modified example of a method for forming a highly doped region according to an embodiment of the preset application.

FIG. 12 is a view illustrating a method of forming highly doped regions 12, 213, 314a and 314b, according to the modified example. Note that the same reference numerals are used to designate the same or similar structural elements corresponding to those in the third embodiment.

First, a chemical solution for forming a silicon oxide containing P is prepared, which serves to form a silicon oxide layer 370 on the surface of the n-type crystalline silicon substrate 301 having a surface texture structure. The n-type crystalline silicon substrate 301 consists of the low-doped region 11 having an n-type dopant concentration lower than those of the highly doped regions 12, 2, 3, 314a and 314b. Then, the n-type crystalline silicon substrate 301 having a texture structure on a surface is soaked in the chemical solution for forming a silicon oxide to form a P-containing oxide layer 370 having a thickness of several to about 20 angstroms, over the entire surface of the n-type crystalline silicon substrate 301 (S1). Then, the n-type crystalline silicon substrate 301 having the P-containing oxide layer 370 on the surface is subjected to a heat treatment in a nitrogen atmosphere or an oxygen atmosphere (S2). Owing to the heat treatment, P contained in the oxide layer 370 diffuses from the surface of the n-type crystalline silicon substrate 301 toward the interior of the substrate to form the highly doped regions 12, 213, 314a and 314b. Thereafter, the n-type crystalline silicon substrate 301 is soaked in a hydrofluoric acid (HF) solution to remove the oxide layer 370 to expose the highly doped regions 12, 213, 314a and 314b in the surface of the n-type crystalline silicon substrate 301 (S3).

The chemical solution for forming a silicon oxide used in the wet process step of S1 is not limited as long as it is an aqueous solution containing a phosphoric acid aqueous solution and serving for oxidizing the surface of silicon. In the modified example, a solution mixture of a nitric acid aqueous solution with a concentration of 85 mass % and a phosphoric acid aqueous solution with a concentration of 70 mass % is used. The mixing ratio of individual aqueous solutions, more specifically, the volume ratio of nitric acid aqueous solution:phosphoric acid aqueous solution, falls in the range of 10:90 to 50:50 and preferably 20:80 to 40:60. The processing temperature of step S1 preferably falls within the range of about 50° C. to 80° C.

The heat treatment (S2), which is a treatment for diffusing a dopant, is carried out under an oxygen or nitrogen atmosphere, and particularly preferably under an oxygen atmosphere. The temperature of the heat treatment falls within the range of preferably 700° C. to 1000° C. and further preferably 800° C. to 950° C. However, the temperature can be appropriately controlled. The time for the heat treatment is, for example, about 10 to 60 minutes, but the time can be appropriately controlled.

The P-containing oxide layer 370 formed by use of the chemical solution for forming a silicon oxide may cover the entire surface of the n-type crystalline silicon substrate 301 or may be formed on a part or in the form of islands. The thickness and formation area of the oxide layer 370 can be controlled by varying the mixing ratio of a plurality of acid aqueous solutions contained in the chemical solution for funning a silicon oxide for use in forming the oxide layer 370, concentrations of the individual acid aqueous solutions, and formation conditions such as temperature, and time for the oxide layer 370. In diffusing P in the n-type crystalline silicon substrate 301 the diffusion depth and the concentration of P can be controlled by varying e.g., the temperature and time for the heat treatment.

In the above modified example of the third embodiment, a method for forming a highly doped region by bringing a solution containing a predetermined conductive-type dopant into contact with a substrate followed by applying a predetermined heat treatment to diffuse the predetermined conductive-type dopant into the substrate has been illustrated. Highly doped regions in the first, second and fourth embodiments may be formed in the same manner as in this method. The n-type crystalline silicon substrate 301 having both a highly doped region and a low-doped region in the surface may be formed, for example, by forming the P-containing oxide layer 370 over the entire surface of the n-type crystalline silicon substrate 301, removing a part of the oxide layer 379 and applying a heat treatment. Alternatively, the n-type crystalline silicon substrate 301 having both a highly doped region and a low-doped region in the surface may be formed by forming the P-containing oxide layer 370 over the entire surface of the n-type crystalline silicon substrate 301, applying a heat treatment to form the highly doped region over the entire surface of the n-type crystalline silicon substrate 301, and removing a part of the highly doped region thus formed by etching, etc.

The n-type crystalline silicon substrate 301 having a highly doped region formed by a wet process and a heat treatment as described above may be subjected to the same manufacturing step as in each of the above embodiments to get a solar cell completed. Even in the case of using a dopant diffusion method employing a wet process and a heat treatment, a solar cell having satisfactory voltage-current characteristic can be formed and suitable results are obtained. Note that a method for forming a highly doped region described in the modified example is just an example. Other than the methods shown in the modified example, a highly doped region can be formed by applying a solution containing a dopant to the surface of a crystalline silicon substrate by a spin coating method or a spray method and then applying a heat treatment.

REFERENCE SIGNS LIST 1, 201, 301, 401, 501, 601 n-type silicon substrate, 2 first-i type amorphous silicon layer, 3 p-type amorphous silicon layer, 4 second i-type amorphous silicon layer, 5 n-type amorphous silicon layer, 10, 210, 310, 410, 510, 610 solar cell, 11, 511, 611 low-doped region, 12, 512, 612 first main-surface side highly doped region, 20 solar cell string, 30 bypass diode, 50 solar cell module, 213 second main-surface side highly doped region, 314 first highly doped side-region, 314b second highly doped side-region, 550 p-type semiconductor layer, 560 n-type semiconductor layer, 370 oxide layer

The invention claimed is:
1. A solar cell comprising
a first conductive-type silicon substrate, and
a second conductive-type amorphous silicon layer positioned on a first main-surface side of the silicon substrate,
wherein
the silicon substrate has a low-doped region which has been doped to be the first conductive-type, and a first main-surface side highly doped region which is provided between the low-doped region and the second conductive-type amorphous silicon layer and has a concentration of a first conductive-type dopant higher than that in the low-doped region, wherein
the silicon substrate has a highly doped side-region which is provided so as to cover the side extending in a thickness direction of the silicon substrate and has a concentration of the first conductive-type dopant higher than that in the low-doped region, and
the highly doped side-region does not form a p-n junction with a portion of the silicon substrate that is adjacent to the highly doped side-region and other than the highly doped side-region.
2. The solar cell according to claim 1, wherein
the first main-surface side highly doped region is provided on both ends of the silicon substrate in a direction substantially perpendicular to a thickness direction.
3. The solar cell according to claim 1, wherein
a surface dopant concentration in the first main-surface side highly doped region is $1 \times 10^{18}$ cm$^{-3}$ or more.
4. The solar cell according to claim 1, wherein
the low-doped region comprises a n-type crystalline silicon, and
the first main-surface side highly doped region is an n$^+$ region which is doped with a larger amount of n-type dopant than that in the low-doped region.
5. The solar cell according to claim 1, wherein
the first main-surface side of the silicon substrate is a non-light incident surface.
6. A solar cell module having series-connected solar cells according to claim 1.
7. The solar cell module according to claim 6, comprising
a bypass diode, which is connected in parallel to two or more solar cells connected in series.
8. The solar cell according to claim 1, further comprising:
a first conductive-type amorphous silicon layer positioned on a second main-surface side of the silicon substrate, wherein
the silicon substrate has the low-doped region and a second main-surface side highly doped region which is provided between the low-doped region and the first conductive-type amorphous silicon layer and has a concentration of the first conductive-type dopant higher than that in the low-doped region, wherein
the silicon substrate includes a first highly doped side-region that is positioned at a first side of the low-doped region in a direction substantially perpendicular to the thickness direction, and a second highly doped side-region that is positioned at a second side of the low-doped region in the direction substantially perpendicular to the thickness direction, wherein each of the first highly doped side-region and the second highly doped side-region extends in the thickness direction;
the first highly doped side-region connects the first main-surface side highly doped region and the second main-surface side highly doped region at the first side in the direction substantially perpendicular to the thickness direction; and
the second highly doped side-region connects the first main-surface side highly doped region and the second main-surface side highly doped region at the second side in the direction substantially perpendicular to the thickness direction.
9. The solar cell according to claim 8, wherein
no highly doped region is provided in a center portion of the silicon substrate on the first main-surface side; and
the first main-surface side highly doped region is provided only at both ends in the direction substantially perpendicular to the thickness direction.
10. The solar cell according to claim 1, wherein the silicon substrate has a second main-surface side highly doped region which has a concentration of the first conductive-type dopant higher than that in the low-doped region and is provided on a second main-surface side of the silicon substrate.
11. The solar cell according to claim 10, wherein the second main-surface side highly doped region is provided over the entire surface of the low-doped region on the opposite side to the side of the amorphous silicon layer.
12. The solar cell according to claim 1, wherein the amorphous silicon layer is provided over an entire surface that is located closer to the silicon substrate than the amorphous silicon layer in the thickness direction of the silicon substrate.

* * * * *